United States Patent
Solhusvik et al.

(10) Patent No.: US 9,185,307 B2
(45) Date of Patent: Nov. 10, 2015

(54) DETECTING TRANSIENT SIGNALS USING STACKED-CHIP IMAGING SYSTEMS

(75) Inventors: Johannes Solhusvik, Haslum (NO); Brian Keelan, Boulder Creek, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 251 days.

(21) Appl. No.: 13/401,607

(22) Filed: Feb. 21, 2012

(65) Prior Publication Data

US 2013/0215290 A1    Aug. 22, 2013

(51) Int. Cl.
H04N 5/235    (2006.01)
H04N 5/355    (2011.01)
H04N 5/3745    (2011.01)

(52) U.S. Cl.
CPC ......... *H04N 5/2355* (2013.01); *H04N 5/35572* (2013.01); *H04N 5/37452* (2013.01); *H04N 5/37455* (2013.01)

(58) Field of Classification Search
USPC ............... 348/208.4, 208.12, 208.13, 208.16; 257/444
See application file for complete search history.

(56) References Cited

U.S. PATENT DOCUMENTS

| 6,016,211 | A  | 1/2000  | Szymanski et al. |
| 6,809,769 | B1* | 10/2004 | Yang ............................. 348/308 |
| 6,839,452 | B1 | 1/2005  | Yang et al. |
| 7,106,374 | B1 | 9/2006  | Bandera et al. |
| 7,200,293 | B2 | 4/2007  | Iwasaki |
| 7,394,148 | B2 | 7/2008  | Karnezos |
| 7,601,942 | B2 | 10/2009 | Underwood et al. |
| 7,906,363 | B2 | 3/2011  | Koyanagi |
| 2002/0149693 | A1* | 10/2002 | Tantalo et al. ................ 348/362 |
| 2007/0152345 | A1 | 7/2007 | Wu et al. |
| 2008/0083939 | A1 | 4/2008 | Guidash |

(Continued)

FOREIGN PATENT DOCUMENTS

| EP | 2234387 | 9/2010 |
| JP | 11-150255 | 6/1999 |
| JP | 2000032344 | 1/2000 |
| JP | 2001189891 | 7/2001 |
| JP | 2002044527 | 2/2002 |

(Continued)

OTHER PUBLICATIONS

Kurion et al, "Intelligent Image Sensor Chip with Three-Dimensional Structure" in 1999 IEDM Technical Digest published in 1999.*

*Primary Examiner* — Sinh Tran
*Assistant Examiner* — Mark Monk
(74) *Attorney, Agent, or Firm* — Treyz Law Group; Michael H. Lyons

(57) ABSTRACT

Imaging systems may be provided with stacked-chip image sensors. A stacked-chip image sensor may include a vertical chip stack that includes an array of image pixels, control circuitry and storage and processing circuitry. The image pixel array may be coupled to the control circuitry using vertical metal interconnects. The control circuitry may provide digital image data to the storage and processing circuitry over additional vertical conductive. The stacked-chip image sensor may be configured to capture image frames at a capture frame rate and to output processed image frames at an output frame rate that is lower that the capture frame rate. The storage and processing circuitry may be configured to process image frames concurrently with image capture operations. Processing image frames concurrently with image capture operations may include adjusting the positions of moving objects and by adjusting the pixel brightness values of regions of image frames that have changing brightness.

15 Claims, 8 Drawing Sheets

(56) References Cited

U.S. PATENT DOCUMENTS

| | | | |
|---|---|---|---|
| 2008/0284888 A1* | 11/2008 | Kobayashi | 348/308 |
| 2010/0019130 A1 | 1/2010 | Lee | |
| 2010/0040344 A1* | 2/2010 | Mizuno et al. | 386/68 |
| 2010/0157072 A1* | 6/2010 | Luo et al. | 348/208.4 |
| 2010/0276572 A1 | 11/2010 | Iwabuchi et al. | |
| 2012/0219235 A1 | 8/2012 | Solhusvik et al. | |
| 2012/0273908 A1 | 11/2012 | Kinsman et al. | |

FOREIGN PATENT DOCUMENTS

| | | |
|---|---|---|
| JP | 2002301057 | 10/2002 |
| JP | 2008118434 | 5/2008 |
| JP | 2010530633 | 9/2010 |
| JP | 2011023917 | 2/2011 |
| JP | 2011078049 | 4/2011 |
| WO | 2006129762 | 7/2006 |
| WO | 2010073520 | 7/2010 |
| WO | 2011097687 | 8/2011 |

* cited by examiner

DETECTING TRANSIENT SIGNALS USING STACKED-CHIP IMAGING SYSTEMS

BACKGROUND

This relates generally to imaging systems, and more particularly, to imaging systems with stacked-chip image sensors.

Image sensors are commonly used in imaging systems such as cellular telephones, cameras, and computers to capture images. In a typical arrangement, an image sensor is provided with an array of image sensor pixels and control circuitry for operating the image sensor pixels. In a conventional imaging system the control circuitry is laterally separated from the image sensor pixels on a silicon semiconductor substrate. Each row of image sensor pixels typically communicates with the control circuitry along a common metal line on the silicon semiconductor substrate. Similarly, each column of image sensor pixels communicates with the control circuitry along a common metal line.

In this type of system, the rate at which image pixel data can be read out from the image sensor pixels and the rate at which control signals can be supplied to the image sensor pixels can be limited by the use of the shared column and row lines. This type of limitation can limit the rate at which image frames may be captured. Transient image signals such as image light from flashing light sources or from moving objects may be improperly represented in image data due to the limited frame rate.

It would therefore be desirable to be able to provide improved imaging systems with enhanced pixel communication efficiency.

DETAILED DESCRIPTION

Digital camera modules are widely used in imaging systems such as digital cameras, computers, cellular telephones, or other electronic devices. These imaging systems may include image sensors that gather incoming light to capture an image. The image sensors may include arrays of image sensor pixels. The pixels in an image sensor may include photosensitive elements such as photodiodes that convert the incoming light into digital data. Image sensors may have any number of pixels (e.g., hundreds or thousands or more). A typical image sensor may, for example, have hundreds of thousands or millions of pixels (e.g., megapixels).

Each image sensor may be a stacked-chip image sensor having a vertical chip stack that includes an image pixel array die, a control circuitry die, and a digital processing circuitry die. The analog control circuitry may be coupled to the image pixel circuitry using vertical conductive paths (sometimes called vertical metal interconnects or vertical conductive interconnects) such as through-silicon vias in a silicon semiconductor substrate. The storage and processing circuitry may be coupled to the analog control circuitry using vertical metal interconnects such as through-silicon vias in the silicon semiconductor substrate. Vertical metal interconnects may be formed at an edge of an image pixel array or throughout an image pixel array. Vertical metal interconnects may be configured to couple rows of image pixels, columns of image pixels, blocks of image pixels, other groups of image pixels, or individual image pixels to the analog control circuitry.

Vertical metal interconnects may be used by the control circuitry to read out image data from image pixels in multiple pixel rows and multiple pixel columns simultaneously thereby increasing the rate at which image data can be obtained from the image pixels in comparison with conventional imaging systems. For example, image data may be captured at a frame rate that is high enough to oversample an oscillating light source such as an LED that oscillates at a frequency of hundreds of cycles per second or to oversample a rapidly moving object such as a tennis racket or a baseball bat being swung by an athlete. Oversampling an oscillating light source may include, for example, capturing image frames at a capture frame rate that is at least twice the number of oscillation cycles per second of the oscillating light source.

In one suitable configuration, each image pixel may be associated with a vertical readout interconnect so that all of the pixels in an image sensor may be reset simultaneously and a single global shutter operation may be used to simultaneously transfer the charge collected in the photodiode of each image pixel to the control circuitry.

Figure 1:
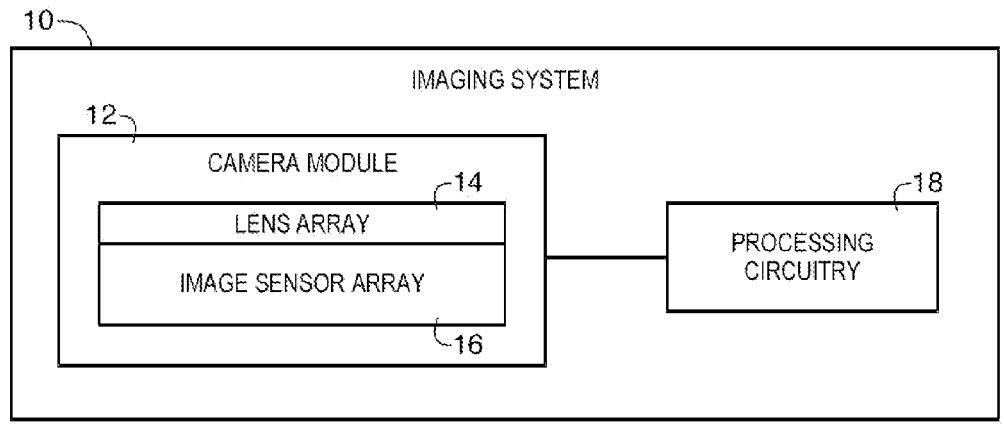
FIG. 1 is a diagram of an illustrative electronic device in accordance with an embodiment of the present invention.

FIG. 1 is a diagram of an illustrative imaging system that uses a stacked-chip image sensor to capture images at a high frame rate in comparison with conventional planar imaging systems. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include an array of lenses 14 and a corresponding array of stacked-chip image sensors 16. Lenses 14 and stacked-chip image sensors 16 may be mounted in a common package and may provide image data to processing circuitry 18.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Image sensor array 16 may contain an array of individual stacked-chip image sensors configured to receive light of a given color by providing each stacked-chip image sensor with a color filter. The color filters that are used for image sensor pixel arrays in the image sensors may, for example, be red filters, blue filters, and green filters. Each filter may form a color filter layer that covers the image sensor pixel array of a respective image sensor in the array. Other filters such as white color filters, dual-band IR cutoff filters (e.g., filters that allow visible light and a range of infrared light emitted by LED lights), etc. may also be used.

An array of stacked-chip image sensors may be formed on one or more semiconductor substrates. With one suitable arrangement, which is sometimes described herein as an example, each vertical layer of a stacked-chip image sensor array (e.g., the image pixel array layer, the control circuitry layer, or the processing circuitry layer) is formed on a common semiconductor substrate (e.g., a common silicon image sensor integrated circuit die). Each stacked-chip image sensor may be identical. For example, each stacked-chip image sensor may be a Video Graphics Array (VGA) sensor with a resolution of 480×640 sensor pixels (as an example). Other types of image sensor may also be used for the image sensors if desired. For example, images sensors with greater than VGA resolution or less than VGA resolution may be used, image sensor arrays in which the image sensors are not all identical may be used, etc. If desired, image sensor array 16 may include a single stacked-chip image sensor.

Figure 2:
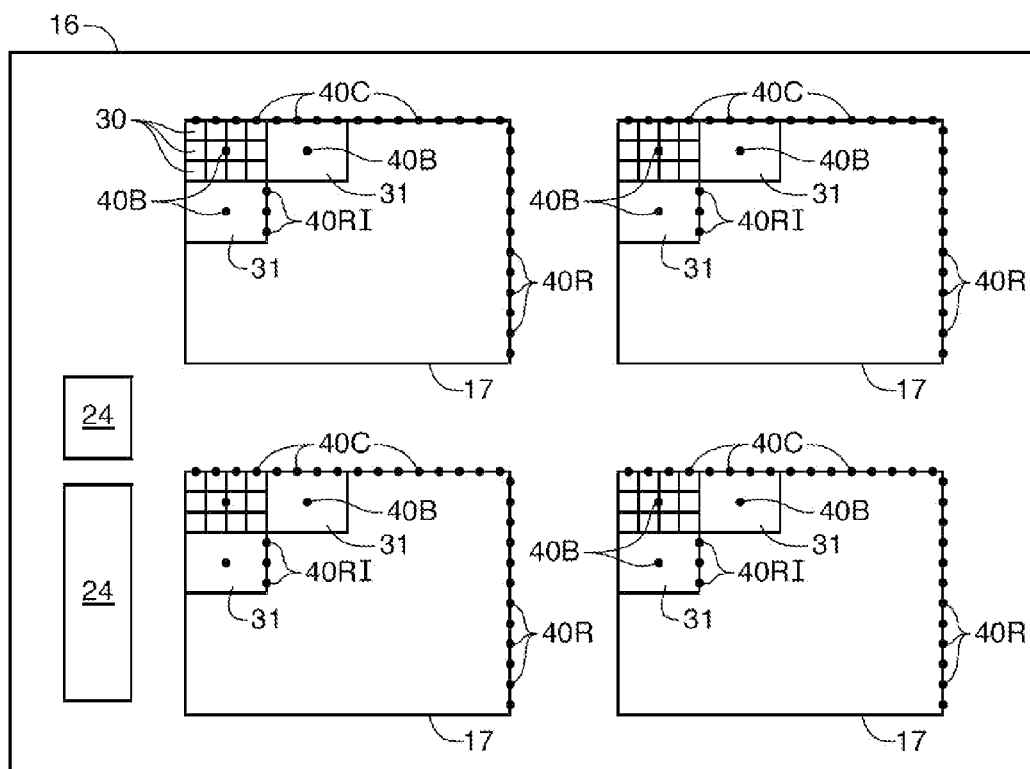
FIG. 2 is a top view of an illustrative image sensor array having a plurality of stacked-chip image sensors each having vertical conductive interconnects for coupling to control circuitry in accordance with an embodiment of the present invention.
Figure 2:
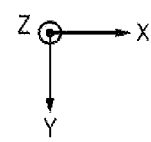

As shown in FIG. 2, image sensor array 16 may include multiple image pixel arrays such as image pixel arrays 17 that are formed on a single integrated circuit die. In the example of FIG. 2, image sensor array 16 includes four stacked-chip image sensors. However, this is merely illustrative. If desired, image sensor array 16 may include a single stacked-chip image sensor, two stacked-chip image sensors, three stacked-chip image sensors, or more than four stacked-chip image sensors.

Each pixel array 17 may have image sensor pixels such as image pixels 30 that are arranged in rows and columns. Each image sensor pixel array 17 may have any suitable resolution (e.g., 640×480, 4096×3072, etc.). Image sensor pixels 30 may be formed on a planar surface (e.g., parallel to the x-y plane of FIG. 2) of a semiconductor substrate such as a silicon die.

As shown in FIG. 2, each image pixel array 17 may be provided with a plurality of vertical conductive paths such as conductive interconnects 40 (e.g., metal lines, through-silicon vias, etc. that run perpendicular to the x-y plane of FIG. 2) such as row interconnects 40R, column interconnects 40C, pixel block interconnects 40B, and internal row interconnects 40RI. Row interconnects 40R, column interconnects 40C, pixel block interconnects 40B, and internal row interconnects 40RI may each be configured to couple one or more image pixels 30 to control circuitry (e.g., analog control circuitry) that is vertically stacked with the associated image pixel array (e.g., stacked in the z-direction of FIG. 2).

For example, a row interconnect 40R may couple an associated row of image sensor pixels 30 to control circuitry such as row driver circuitry that is vertically stacked with an image pixel array 17. Row interconnects 40R may be coupled to pixel rows along an edge of image pixel array 17. Each pixel row may be coupled to one of row interconnects 40R. A column interconnect 40C may couple an associated column of image sensor pixels 30 to control circuitry that is vertically stacked with an image pixel array 17. A block interconnect 40B may couple an associated block (e.g., blocks 31) of image sensor pixels 30 (e.g., a 4×4 pixel block, an 8×8 pixel block, a 16×16 pixel blocks, a 32×32 pixel block, etc.) to control circuitry such as analog-to-digital conversion circuitry that is vertically stacked with an image pixel array 17. An internal row interconnect 40RI may couple a portion of a row of image sensor pixels 30 to control circuitry that is vertically stacked with an image pixel array 17. Each pixel row in image pixel array 17 may be coupled to multiple internal row interconnects 40RI. Internal row interconnects 40RI may be coupled to image pixels 30 along an edge of one or more pixel blocks 31 and may couple the pixels 30 of that pixel block 31 to the control circuitry.

Row interconnects 40R, column interconnects 40C, pixel block interconnects 40B, and internal row interconnects 40RI may each be formed from, for example, through-silicon vias that pass from a first silicon semiconductor substrate (e.g., a substrate having an image pixel array) to a second silicon semiconductor substrate (e.g., a substrate having control and readout circuitry for the image pixel array).

Image sensor array 16 may, if desired, also include support circuitry 24 that is horizontally (laterally) separated from image pixel arrays 17 on the semiconductor substrate.

Figure 3:
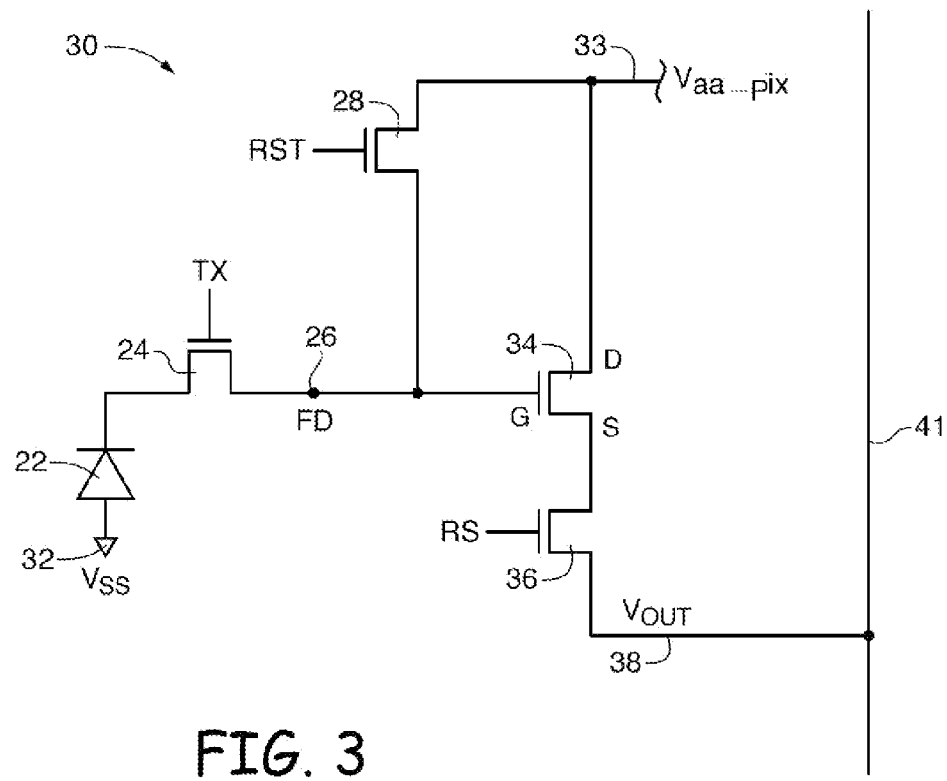
FIG. 3 is a diagram of an illustrative image sensor pixel in accordance with an embodiment of the present invention.

Circuitry in an illustrative pixel of one of the stacked-chip image pixel arrays in sensor array 16 is shown in FIG. 3. As shown in FIG. 3, pixel 30 may include a photosensitive element such as photodiode 22. A positive pixel power supply voltage (e.g., voltage Vaa_pix) may be supplied at positive power supply terminal 33. A ground power supply voltage (e.g., Vss) may be supplied at ground terminal 32. Incoming light is collected by photodiode 22 after passing through a color filter structure. Photodiode 22 converts the light to electrical charge.

Before an image is acquired, reset control signal RST may be asserted. This turns on reset transistor 28 and resets charge storage node 26 (also referred to as floating diffusion FD) to Vaa. The reset control signal RST may then be deasserted to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 22. The signal associated with the stored charge on node 26 is conveyed to row select transistor 36 by source-follower transistor 34.

If desired, other types of image pixel circuitry may be used to implement the image pixels of sensors 16. For example, each image sensor pixel 30 (see, e.g., FIG. 1) may be a three-transistor pixel, a pin-photodiode pixel with four transistors, a global shutter pixel, etc. The circuitry of FIG. 3 is merely illustrative.

When it is desired to read out the value of the stored charge (i.e., the value of the stored charge that is represented by the signal at the source S of transistor 34), select control signal RS can be asserted. When signal RS is asserted, transistor 36 turns on and a corresponding signal Vout that is representative of the magnitude of the charge on charge storage node 26 is produced on output path 38. In a typical configuration, there are numerous rows and columns of pixels such as pixel 30 in the image sensor pixel array of a given image sensor. A conductive path such as path 41 can be associated with one or more pixels such as a column of pixels or a block of pixels.

When signal RS is asserted in a given row, a given block or a given portion of a row of pixels, path 41 can be used to route signal Vout from that row to readout circuitry. Path 41 may, for example, be coupled to one of column interconnects 40C. Image data such as charges collected by photosensor 22 may be passed along one of column interconnects 40C to associated control and readout circuitry that is vertically stacked with image pixel arrays 17.

Figure 4:
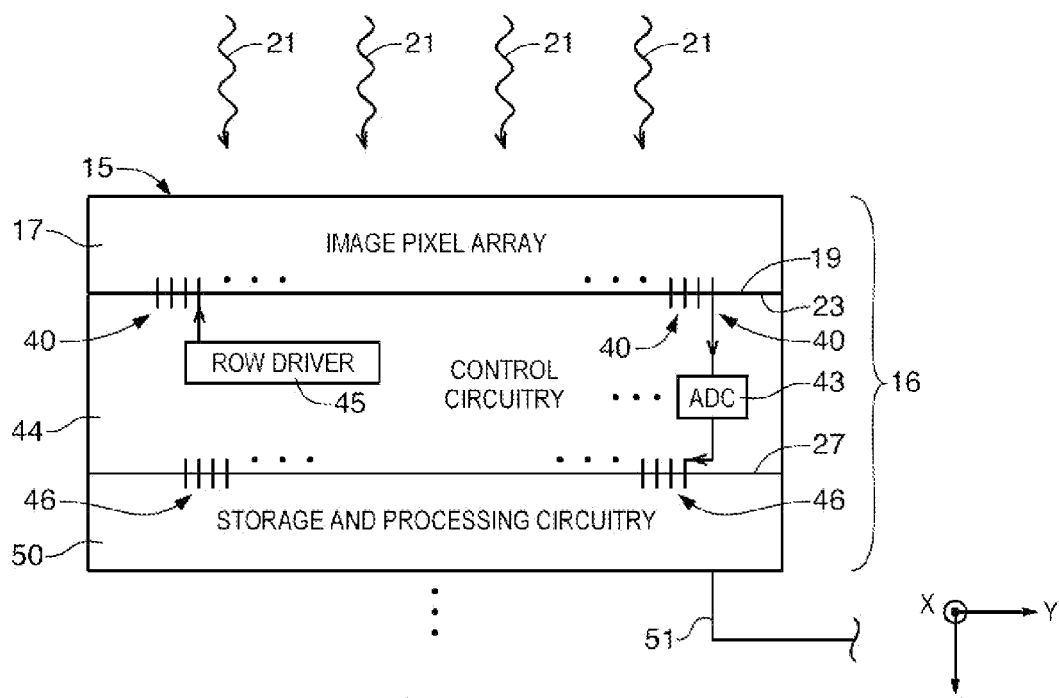
FIG. 4 is a diagram of an illustrative stacked-chip image sensor having an image pixel array in a vertical chip stack that includes analog control circuitry and storage and processing circuitry coupled by vertical metal interconnects in accordance with an embodiment of the present invention.

As shown in FIG. 4, an image pixel array such as image pixel array 17 may be formed in a vertical chip stack with analog control and readout circuitry such as control circuitry 44 and storage and processing circuitry such as storage and processing circuitry 50. Image pixel array 17 may be a frontside illuminated (FSI) image pixel array in which image light 21 is received by photosensitive elements through a layer of metal interconnects or may be a backside illuminated (BSI) image pixel array in which image light 21 is received by photosensitive elements formed on a side that is opposite to the side on which the layer of metal interconnects is formed.

Image pixel array 17 may be formed on a semiconductor substrate that is configured to receive image light 21 through a first surface (e.g., surface 15) of the semiconductor substrate. Control circuitry 44 may be formed on an opposing second surface (e.g., surface 19) of the semiconductor substrate. Control circuitry 44 may be formed on an additional semiconductor substrate (semiconductor integrated circuit die) having a surface such as surface 23 that is attached to surface 19 of image pixels array 17. Control circuitry 44 may be coupled to image pixels in image pixel array 17 using vertical conductive paths (vertical conductive interconnects) 40 (e.g., row interconnects 40R, column interconnects 40C, pixel block interconnects 40B, and/or internal row interconnects 40RI of FIG. 2). Vertical conductive interconnects 40 may be formed from metal conductive paths or other conductive contacts that extend through surface 19 and surface 23. As examples, vertical conductive interconnects 40 may include through-silicon vias that extend through surface 19 and/or surface 23, may include microbumps that protrude from surface 19 into control circuitry substrate 44 through surface 23, may include microbumps that protrude from surface 23 into image pixel array substrate 17 through surface 23, or may include any other suitable conductive paths that vertically couple pixel circuitry in image pixel array 17 to control circuitry 44.

Image pixel array 17 may include one or more layers of dielectric material having metal traces for routing pixel control and readout signals to image pixels 30. Vertical conductive interconnects 40 (e.g., row interconnects 40R, column interconnects 40C, pixel block interconnects 40B, and/or internal row interconnects 40RI of FIG. 2) may be coupled to metal traces in image pixel array 17.

Image data such as signal Vout (FIG. 3) may be passed from pixel output paths 40 (FIG. 3) along interconnects 40 from image pixel array 17 to control circuitry 44. Control signals such as reset control signal RST, row/pixel select signal RS, transfer signal TX or other control signals for operating pixels 30 may be generated using control circuitry 44 and passed vertically to pixels 30 in image pixel array 17 along vertical interconnects 40.

Control circuitry 44 may be configured to operate pixels 30 of image pixel array 17. Control circuitry 44 may include row control circuitry (row driver circuitry) 45, bias circuitry (e.g., source follower load circuits), sample and hold circuitry, correlated double sampling (CDS) circuitry, amplifier circuitry, analog-to-digital (ADC) conversion circuitry 43, data output circuitry, memory (e.g., buffer circuitry), address circuitry, etc. Control circuitry 44 may be configured to provide bias voltages, power supply voltages or other voltages to image pixel array 17. Control circuitry 44 may be formed as a stacked layer of image pixel array 17 that is coupled to pixel circuitry of pixel array 17 or may be formed on an additional semiconductor integrated circuit die that is coupled to image pixel array 17 using interconnects 40. Some interconnects 40 may be configured to route image signal data from image pixel array 17 to ADC circuit 43. Digital image data from ADC converter 43 may then be provided to processing circuitry and storage 50. Storage and processing circuitry 50 may, for example, be an image coprocessor (ICOP) chip that is stacked with control circuitry 44.

Image data signals read out using control circuitry 44 from photosensitive elements on image pixel array 17 may be passed from control circuitry 44 to storage and processing circuitry 50 that is vertically stacked (e.g., in direction z) with image pixel array 17 and control circuitry 44 along vertical interconnects such as interconnects 46. Vertical interconnects 46 may include through-silicon vias, microbumps or other suitable interconnects that couple metal lines in control circuitry 44 to metal lines in processing circuitry and storage 50.

Circuitry 50 may be partially integrated into control circuitry 44 or may be implemented as a separated semiconductor integrated circuit that is attached to a surface such as surface 27 of control circuitry 44. Image sensor 16 may include additional vertical conductive interconnects 46 such as metal conductive paths or other conductive contacts that extend through surface 27. As examples, vertical conductive interconnects 46 may include through-silicon vias that extend through surface 27, may include microbumps that protrude from surface 27 into processing circuitry substrate 50, or may include any other suitable conductive paths that vertically couple control circuitry 44 to storage and processing circuitry 50.

Processing circuitry 50 may include one or more integrated circuits (e.g., image processing circuits, microprocessors, storage devices such as random-access memory and non-volatile memory, etc.) and may be implemented using components that are separate from control circuitry 44 and/or that form part of control circuitry 44.

Image data that has been captured by image pixel array 17 may be processed and stored using processing circuitry 50. Image data may be captured at a first frame rate using image pixel array 17 and processed using storage and processing circuitry 50. Processed image data may be stored in storage and processing circuitry 50 or may be passed to external circuitry such as circuitry 18 along, for example, path 51. Processed image data may be passed to circuitry 18 at a second frame rate that is lower than the first frame rate at which the image data is captured using image pixel array 17. Some image frames captured at the first frame rate may be combined to form the processed image data that is output at the lower frame rate.

Processing circuitry 50 formed in a vertical stack with image pixels of a stacked-chip image sensor may, for example, select a subset of digital image data to use in constructing a final image, may combine multiple frames that contain transient signals (e.g., image signals from a flashing light or a moving object) to form corrected image frames, may extract image depth information, or may provide processing options to a user of system 10.

Circuitry 50 may be used to blend image data from red, blue, and green sensors to produce full-color images, may be used to determine image parallax corrections, may be used to produce 3-dimensional (sometimes called stereo) images using data from two or more different sensors that have different vantage points when capturing a scene, may be used to produce increased depth-of-field images using data from two or more image sensors, may be used to adjust the content of an image frame based on the content of a previous image frame, or may be used to otherwise process image data.

In some modes of operation, multiple stacked-chip image sensors on array 16 may be active (e.g., when determining 3-dimensional image depth information). In other modes of operation (e.g., color imaging), only a subset of the image sensors may be used. Other sensors may be inactivated to conserve power (e.g., their positive power supply voltage terminals may be taken to a ground voltage or other suitable power-down voltage and their control circuits may be inactivated or bypassed).

Processing circuitry 50 may be configured to perform white balancing, color correction, high-dynamic-range image combination, motion detection, object distance detection, or other suitable image processing on image data that has been passed vertically from control circuitry 44 to processing circuitry 50. Processed image data may, if desired, be provided to external equipment (e.g., a computer, other device, or additional processing circuitry such as processing circuitry 18) using wired and/or wireless communications paths coupled to processing circuitry 50.

Figure 5:
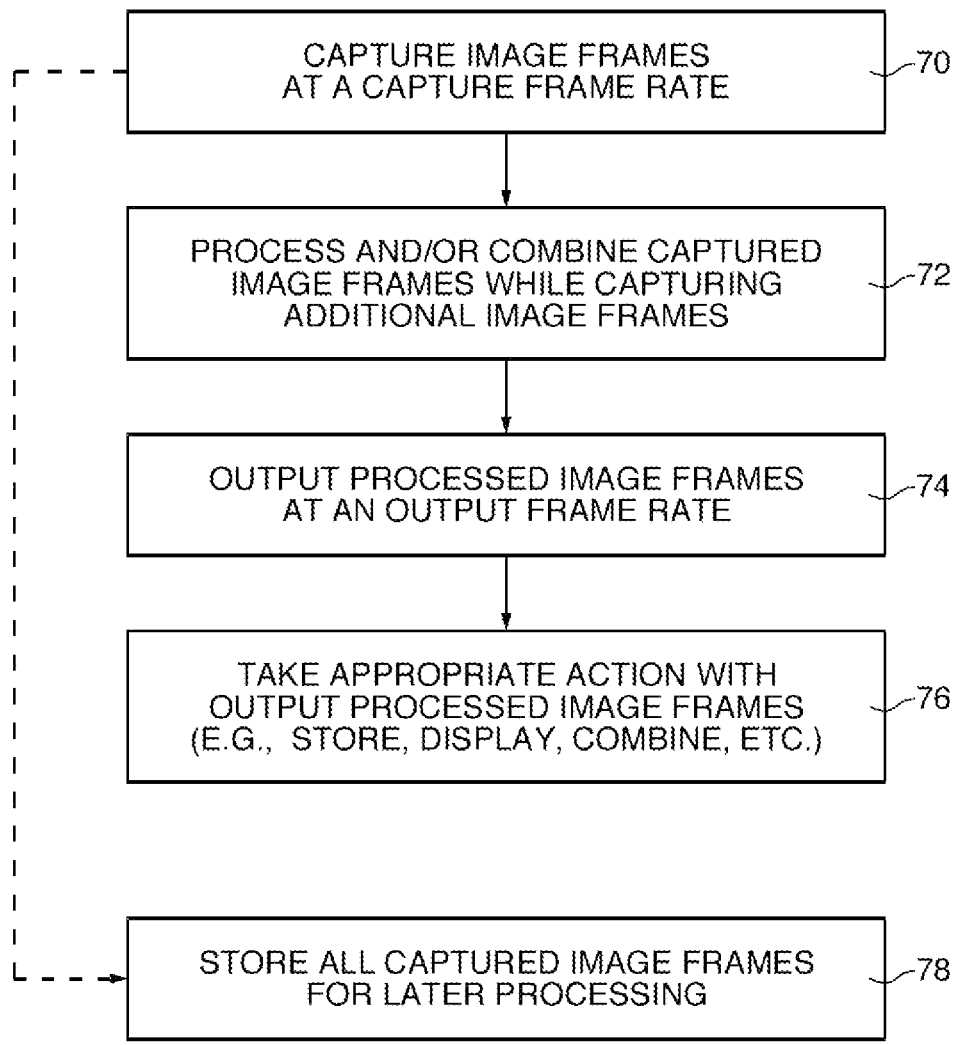
FIG. 5 is a flow chart of illustrative steps involved in capturing and processing high-frame-rate image data using a stacked-chip image sensor in accordance with an embodiment of the present invention.

FIG. 5 is a flow chart of illustrative steps that may be used in capturing and processing high-frame-rate image data using a stacked-chip image sensor such as stacked-chip image sensor 16.

At step 70, image frames may be captured at a capture frame rate. Image frames may be captured using one or more of image pixel arrays 17 of FIGS. 2 and 4. Image frames may be read out along vertical interconnects such as block interconnects 40B or other vertical interconnects 40. The capture frame rate may, for example, be suitably high to capture multiple images per cycle of a cycling light source (e.g., the capture frame rate may correspond to a multiple of the frequency of an LED light source). Captured images may be captured with a common exposure (integration time) or may be captured using multiple different exposure times.

At step 72, the image frames captured at step 70 may be processed and/or combined (e.g., using control circuitry 44 and processing circuitry 50) while additional frames are captured at the first frame rate. Processing and combining image frames may include detecting moving objects in image frames, detecting regions of changing brightness in image frames, correcting image data that includes moving objects, adjusting (e.g., averaging) pixel signal data over multiple frames for image pixels in a region of changing brightness (e.g., for image pixels that receive light from a transient or oscillating light source) combining image data from short-exposure and long-exposure image frames to form high-dynamic range images, or other image processing and combining steps.

For example, processing image frames may include rendering an image of a moving object at an intermediate image position that is anywhere between (and including) the first and last detected positions of the moving object (e.g., during the first and last high-speed captures) in multiple image frames. Processing image frames may include computing motion information such as a trajectory and velocity of a moving object (or similar information such as expected timing and position of the moving object), communicating the computed motion information from one set of pixels (e.g., a block of image pixels in an image pixel array or an image pixel array on an array of image sensors) to an additional pixel set (e.g., an additional block of image pixels in the same image pixel array or an additional image pixel array on the same array of image sensors or another array of image sensors), and processing subsequently captured image frames with the additional pixel set using the communicated motion information.

Processing the subsequently captured image frames using the communicated motion information may include, as examples, adjusting image capture operations by adjusting the exposure time of subsequent image captures for some pixel sets (e.g., in response to an approaching bright moving object or in response to brightness information such as saturation information associated with a transiently bright object) or processing and returning image data from the additional pixel set to the first pixel set (e.g., when the first pixel set is accumulating data for a moving object that has moved into the additional pixel set). Image signals from a first set of image pixels may be replaced by image signals from a second set of image pixels by control circuitry 44 during readout of image frames so that the replaced image signals from the second set of image pixels may be combined with previously stored image signals from the first set of image pixels by the storage and processing circuitry.

At step 74, processed image frames may be output from processing circuitry 50 at an output frame rate. The output frame rate may be lower than the capture frame rate. However, this is merely illustrative. The output frame rate may, if desired, be substantially the same as the capture frame rate.

At step 76, the imaging system may take appropriate action with the output image frames. Appropriate action may include storing the output image frames, displaying the output image frames, or further processing and combining the output image frames (e.g., using a user-controlled image processing application). Appropriate action may include adjusting image readout operations or adjusting image capture operations based on information obtained from the captured image frames (e.g., based on determined motion information or determined brightness or illumination information).

At optional step 78, raw captured image frames captured at the capture frame rate may be stored using storage and processing circuitry 50 for later processing.

Figure 6:
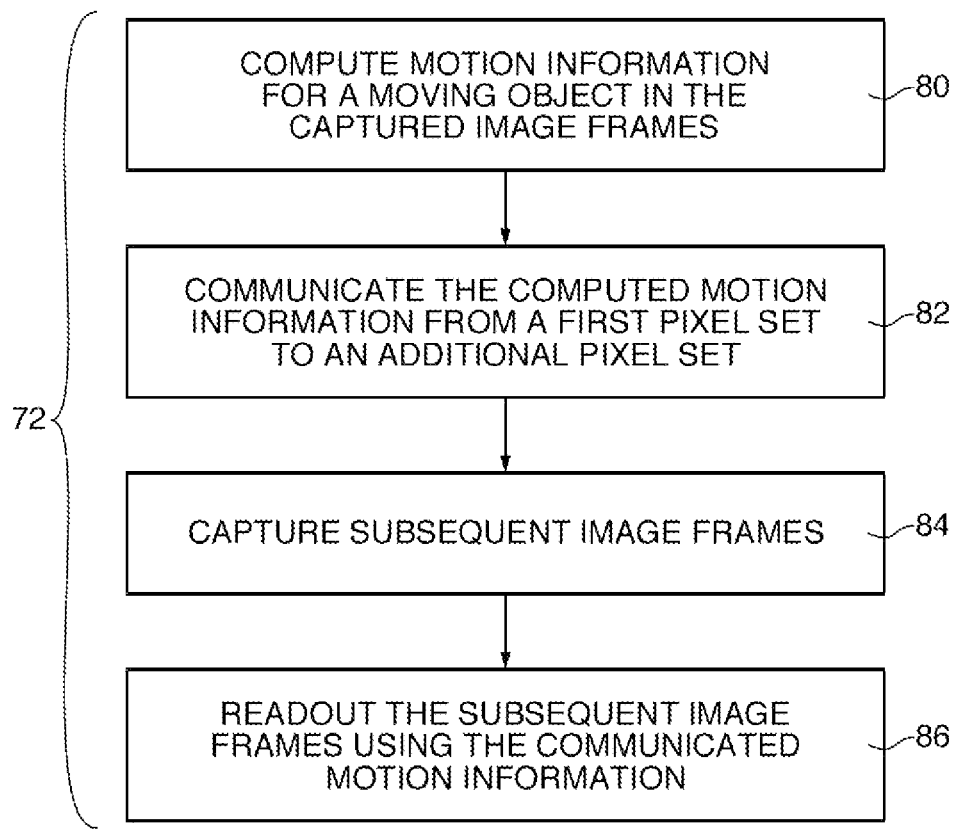
FIG. 6 is a flow chart of illustrative steps involved in processing and combining high-frame-rate image frames to generate a lower frame rate output using a stacked-chip image sensor in accordance with an embodiment of the present invention.

FIG. 6 is a flow chart of illustrative steps that may be used for processing and combining high-frame-rate image data containing one or more moving objects as described above in connection with step 72 of FIG. 5.

At step 80, motion information such as a trajectory and a velocity of a moving object (or similar information such as expected position as a function of time of the moving object) may be computed (e.g., using storage a processing circuitry 50 of FIG. 4). Motion information may, as an example, include a moving object bit (or bits) along with a pixel array address and time information that indicates that a detected moving object will likely be present in the pixels at or near the pixel array address at or near a time specified in the time information.

At step 82, the computed motion information may be communicated from a first set of pixels (e.g., a block of image pixels in an image pixel array or an image pixel array on an array of image sensors) to an additional set of pixels (e.g., an additional block of image pixels in the same image pixel array or an additional image pixel array on the same array of image sensors or on another array of image sensors). Communicating motion information from one set of pixels to an additional set of pixels may, as an example, include sending the moving object bit (or bits) to a processing or control circuit associated with the additional set of pixels. The additional set of pixels may be pixels at or near the pixel array address in the motion information. A pixel array address may include the array address of a single pixel or a group (e.g., a block) of pixels.

At step 84, additional (subsequent) image frames may be captured using some or all of image pixels 30 of image pixel arrays 17 of FIGS. 2 and 4.

At step 86, subsequent image frames may be read out and processed (e.g., using storage and processing circuitry 50) using the communicated motion information. Processing the subsequent image frames using the communicated motion information may include determining from the motion information (e.g., from a moving object bit or bits) that image data in the subsequent image frames should be read out and/or processed differently from image data in previously captured image frames. Processing subsequent image data differently from image data in previously captured image frames may include communicating the subsequently captured image data from the additional set of pixels to the first set of pixels so that moving object data in the additional set of pixels in the subsequent frames may be stacked (or otherwise combined) with moving object data in the first set of pixels in the previously captured image frames.

Figure 7:
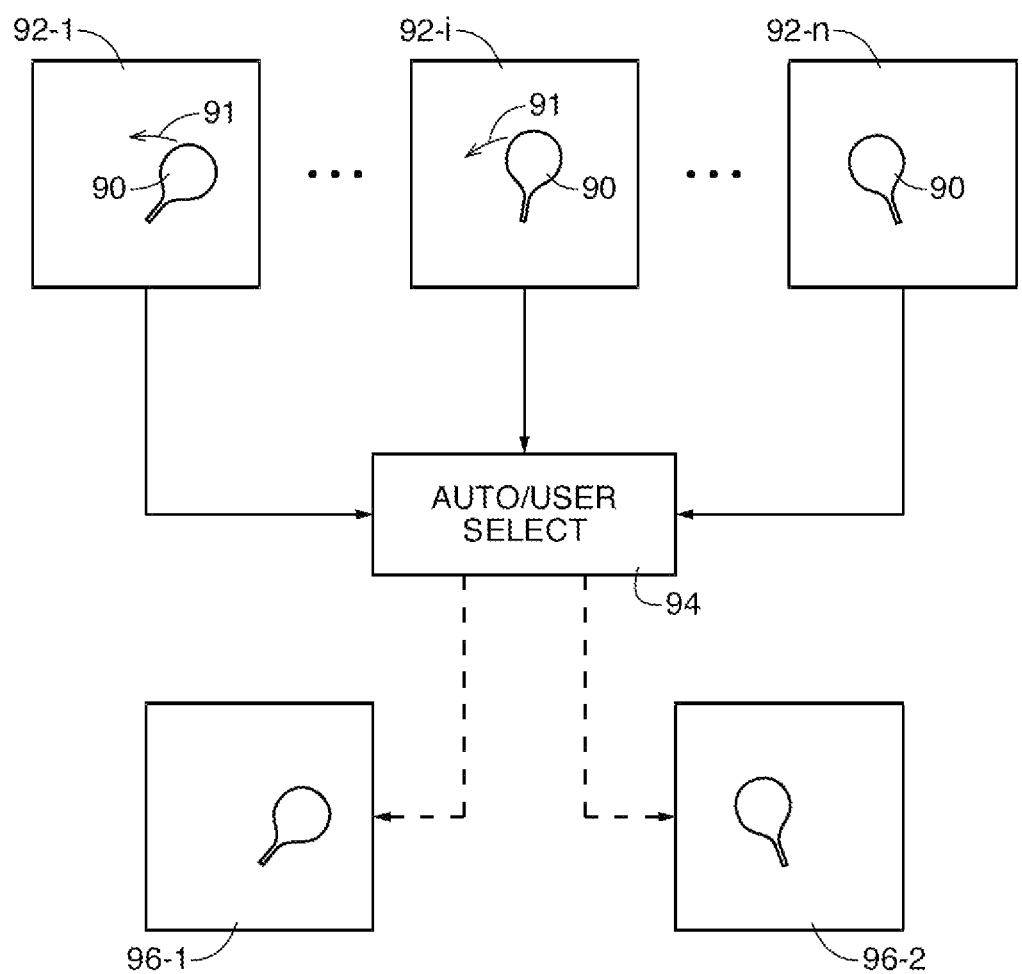
FIG. 7 is an illustrative diagram showing how high-frame-rate image frames may be processed and combined to form output images of a moving object in selected positions in accordance with an embodiment of the present invention.

As shown in FIG. 7, images of a moving object may be captured in multiple positions and/or locations in multiple image frames 92 (e.g., image frame 92-1, image frame 92-i, image frame 92-N, etc.). In the example of FIG. 7, an image of object 90 is captured in a first position in a first image frame 92-1, in a second position in a subsequent image frame 92-I, and in a final position in an Nth image frame 92-N. Object 90 may be a fast-moving object such as a tennis racket in the process of being swung in direction 91 by, for example, an athlete. An imaging device such as device 10 having a stacked-chip image sensor may be able to capture many (e.g., hundreds) of images of moving object 90 during its motion at the capture frame rate.

During image capture operations, a stacked-chip imager may be configured to automatically select a position (e.g., select an image frame including or between image frames 92-1 and 92-N using selection engine 94) and combine some or all image frames including and between image frames 92-1 and 92-N to form an output image frame such as image frame 96-1. Output image frame 96-1 may include a combination of image frames in which each image frame has been motion corrected to overlay the images of object 90 in that image frame with the position in which object 90 was imaged in first image frame 92-1. Based on determined motion information in some image frames (e.g., frames 92-1 and 92-i), image readout operations may be altered by control circuitry 44 to replace image signals in frame 92-N that are associated with the position of object 90 in, for example, frame 92-1 with the image signals associated with object 90 in frame 92-N. In this way, the read out of image signals associated with the position of object 90 in frame 92-1 always contains image signals from the moving object regardless of the motion of the moving object.

Because object 90 is imaged using multiple different combinations of image pixels, output combined image frame 96-1 of object 90 may be rendered at much higher resolution than any single image frame thereby providing high resolution, motion-corrected images of moving objects.

The example of output image frame 96-1 is merely illustrative. Selection engine 94 may select the final position of object 90 (e.g., select image frame 92-N) as the output position of object 90 so that an output frame such as output frame 96-2 may be output from stacked-chip image sensor 16. Output image frame 96-2 may include a combination of image frames in which each image frame has been motion corrected to overlay the images of object 90 in the position in which object 90 was imaged in image frame 92-N. If desired, any image between image frame 92-1 and image frame 92-N may be selected by selection engine 94.

Selection engine 94 may be implemented as a portion of storage and processing circuitry 50 and/or processing circuitry 18 of device 10. If desired, image frames such as image frames 92-1, 92-i, and 92-N may be stored using storage and processing circuitry 50 and/or processing circuitry 18 and decision engine 94 may provide a user of device 10 with the choice of which position of object 90 should be used for a final output image.

Figure 8:
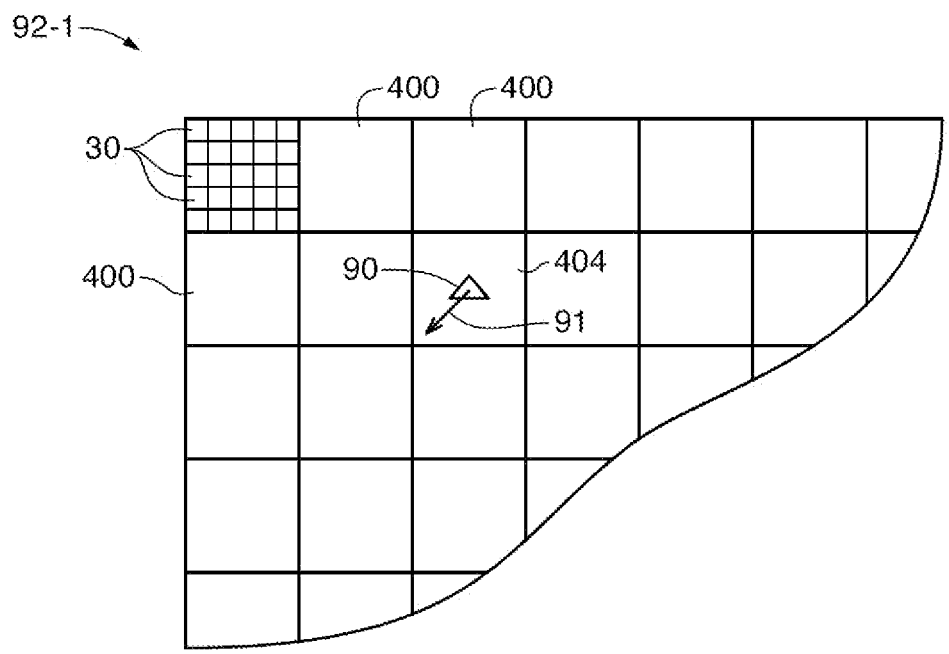
FIG. 8 is a diagram of a portion of an illustrative image frame containing a moving object in a given image block in accordance with an embodiment of the present invention.
Figure 9:
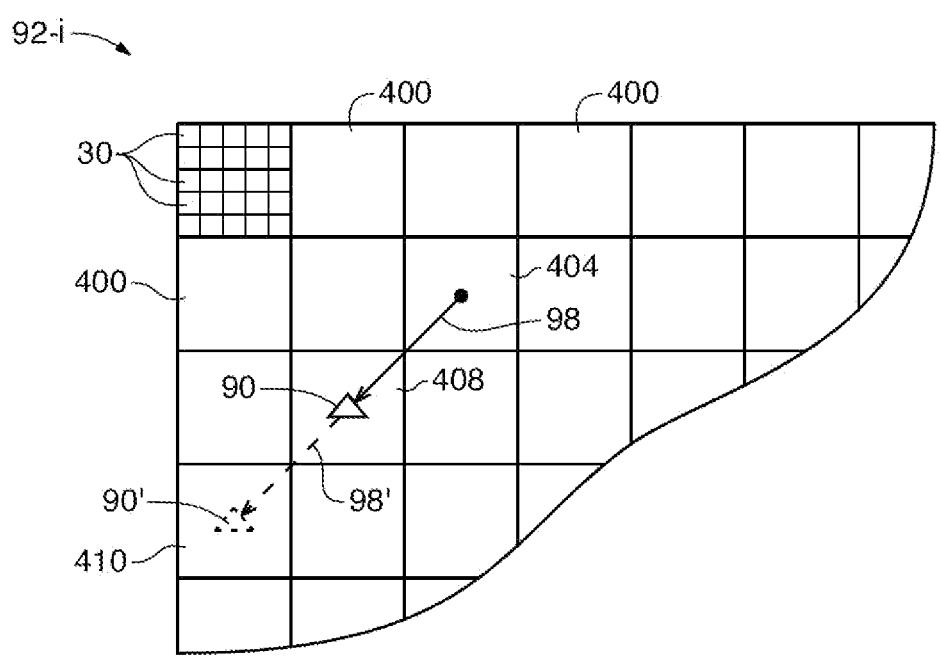
FIG. 9 is a diagram of a portion of an illustrative image frame containing a moving object in a given image block showing how motion of an object from one image block to another image block between image frames may be used to predict the location of the moving object in upcoming image frames in accordance with an embodiment of the present invention.

FIGS. 8 and 9 are diagrams that collectively show how a moving object may be detected in a first set of image pixels and motion information may be communicated from the first set of image pixels to additional sets of image pixels. FIG. 8, shows a portion of an illustrative image frame such as image frame 92-1. Image frame 92-1 may be divided into image blocks 400. Each image block 400 may contain a plurality of image pixels 30. Image blocks 400 may include an equal number of pixel rows and pixel columns (e.g., square blocks of 2 pixel rows and 2 pixel columns, 3 pixel rows and 3 pixel columns, 10 pixel rows and 10 pixel columns or any other equal number of pixel rows and pixel columns). Alternatively, image blocks 400 may include a different number of pixel rows and pixel columns (e.g., rectangular blocks of 1 pixel row and 3 pixel columns, 5 pixel rows and 3 pixel columns, or any other suitable combination of pixel rows and pixel columns).

If desired, image blocks 400 may have a shape that is neither square nor rectangular (e.g., a pixel block may contain 3 pixels of one pixel row, 5 pixels of another pixel row and 10 pixels of a third pixel row, or any arbitrary grouping of adjacent pixels). The size and shape of pixel blocks 400 may be determined based on the content of the image frame.

All image blocks 400 may include the same number of pixels 30 or some image blocks 400 may include different numbers of pixels than other image blocks 400. All image blocks 400 may have the same shape (e.g., all image blocks 400 may be square or all image blocks 400 may be rectangular), or some image blocks 400 may have different shapes than other image blocks 400 (e.g., each image frame may include some square image blocks, some rectangular image blocks, and some non-square and non-rectangular image blocks). As shown in FIG. 8, image frame 92-1 may include an object such as object 90. Object 90 may be partially or completely contained in a particular image block such as image block 404. The size and shape of each image block 400 may be chosen arbitrarily or may be optimized based on image contents (e.g., the size and shape of a particular image block may be chosen to correspond to the size and shape of an object such as object 90).

FIG. 9 shows a portion of an illustrative subsequent image such as image frame 92-i. As shown in FIG. 9, due to the motion of object 90 in direction 91, object 90 appears in a different pixel block (e.g., pixel block 408) in image 92-i than in image 92-1. Motion information such as a motion vector 98 may be determined based on the relative positions of objects 90 and the time between captures of images 92-i and 92-1. Motion information such as a predictive motion vector 98' may be determined that indicates the predicted motion of object 90 between image frame 92-i and a further subsequent image frame. Motion vector 98' may indicate that object 90 may appear at a location (position) 90' in an additional image block such as image block 410.

During operation of stacked-chip image sensor 16, motion information that may include motion vector 98' may be communicated from block 408 to block 410 that causes image data in the further subsequent image frame to be used to replace image data in image block 408 during readout of image frame 92-i. The replaced image data may be used by circuitry 50 for stacking (or otherwise combining) with detected of object 90 in that image block in a previous image frame such as frame 92-1.

The examples of FIGS. 8 and 9 in which a stacked-chip image sensor is used to detect and correct for high-speed moving objects is merely illustrative. A stacked-chip image sensor may be used to detect objects or regions having rapidly changing brightness as shown in FIGS. 10 and 11.

Figure 10:
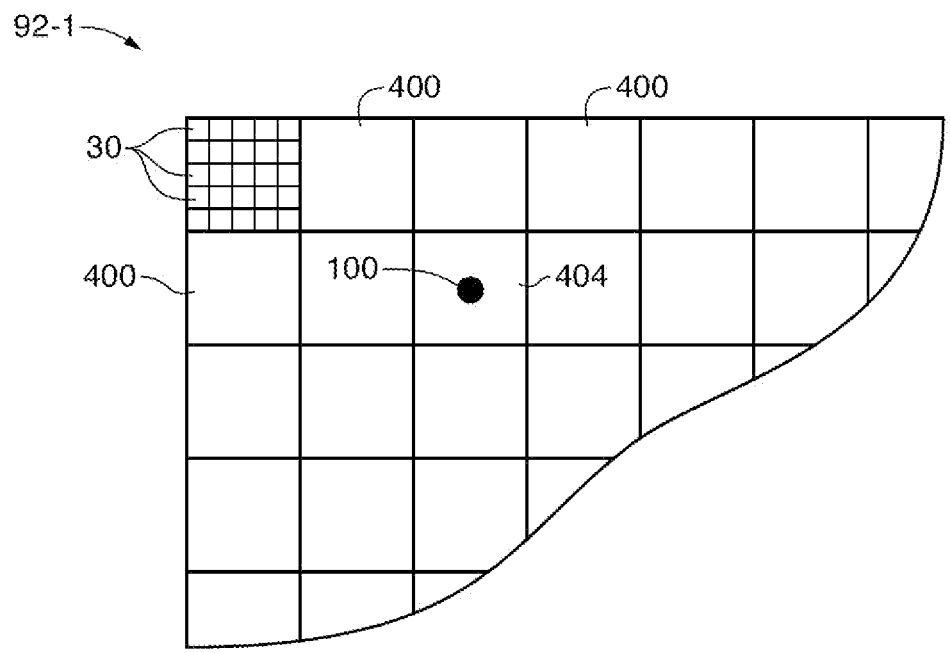
FIG. 10 is a diagram of a portion of an illustrative image frame containing a region of changing brightness in accordance with an embodiment of the present invention.

As shown in FIG. 10, a region of changing brightness such as oscillating light source 100 may be captured in image block 404 in image frame 90-1. Oscillating light source 100 may be a light-emitting object such as one or more LEDs or may be a non-emitting object that is illuminated by a rapidly oscillating light source such as one or more LEDs.

Figure 11:
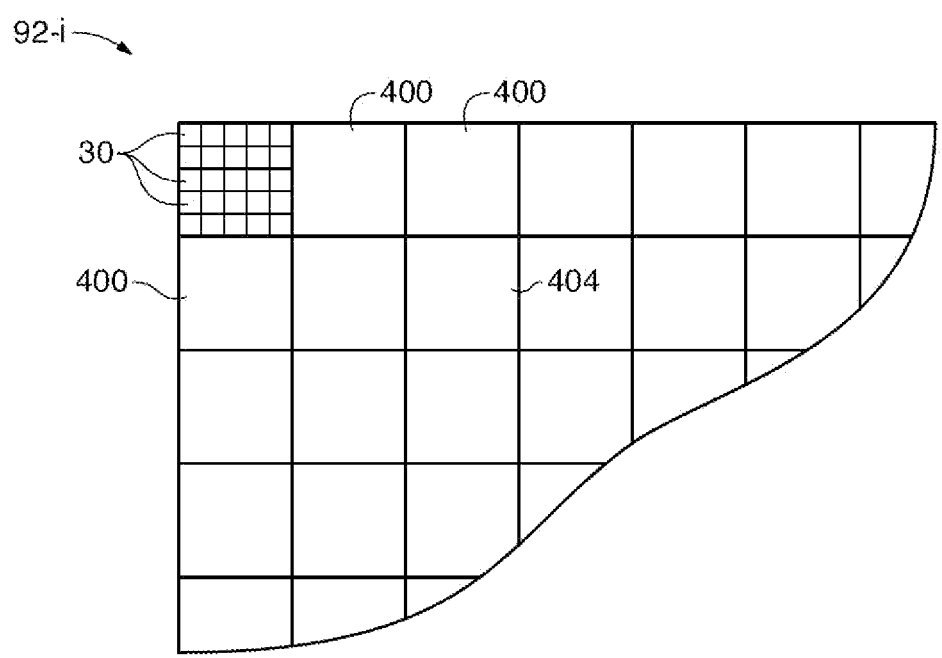
FIG. 11 is a diagram of a portion of an illustrative image frame in which an object in a region of changing brightness does not appear in a given image block in which the object previously appeared in accordance with an embodiment of the present invention.

As shown in FIG. 11, a subsequent image frame such as image frame 92-i may capture an image of the region of changing brightness (e.g., of object 100) at a time during which object 100 is not illuminated (e.g., at time when the oscillating brightness of object 100 is at a minimum). During image combination and readout operations, a low-frame rate image capture operation such as an image capture operation performed by a conventional planar image sensor may undersample the oscillating brightness of object 100 and may therefore be unable to correctly render object 100 in an output image frame. However, a stacked-chip image sensor having vertical conductive readout paths may be configured to oversample the oscillations in brightness of, for example, a 100 Hz or higher frequency light source. The stacked-chip image sensor may be able to combine portions of oversampled image frames to determine an appropriate intermediate brightness level for the region of changing brightness and to adjust the brightness level of the region of changing brightness to form a combined output image frame that correctly (e.g., relative to other, constantly-illuminated objects in a scene) renders the brightness of the region of changing brightness.

If desired, stacked-chip image sensors may be configured to capture image frames at a capture frame rate and to output image frames that have been corrected for moving objects and changing-brightness regions at a lower output frame rate.

Figure 12:
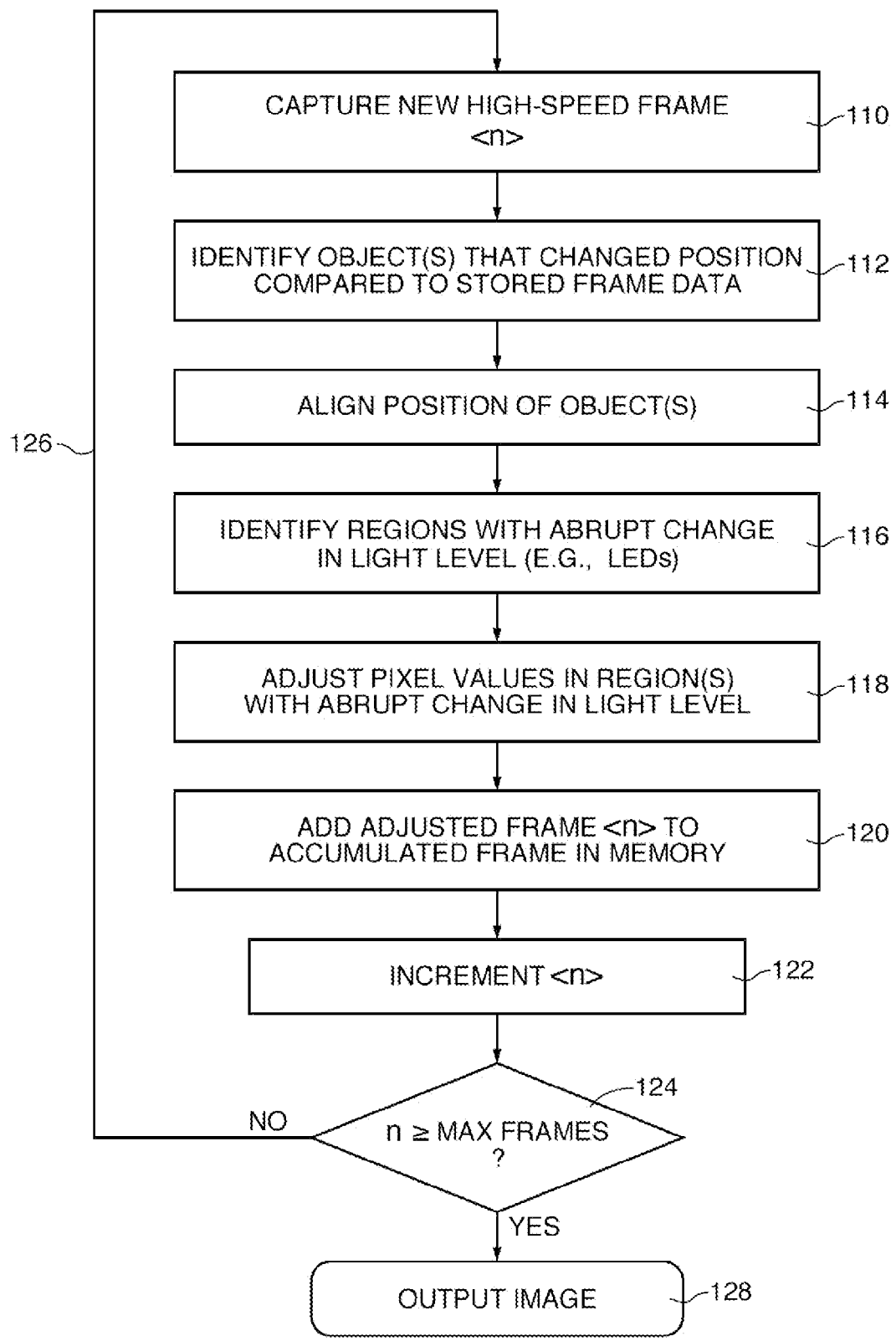
FIG. 12 is a flow chart of illustrative steps involved in correcting transient image signals in high-frame-rate image data using a stacked-chip image sensor in accordance with an embodiment of the present invention.

FIG. 12 is a flow chart of illustrative steps that may be used for capturing image frames at a capture frame rate and outputting image frames that have been corrected for moving and oscillating-brightness objects at a lower output frame rate using a stacked-chip image sensor.

At step 110 a new image frame <n> may be captured using image pixels such as image pixels 30 of a stacked-chip image sensor. Captured image data may be read out over vertical conductive interconnects 40 to control circuitry 44 and processing circuitry 50 (see e.g., FIG. 4).

At step 112, objects that have changed position with respect to positions in previously captured image frames (e.g., an image frame <n−1>, not shown) may be identified. Previously captured image frames may be stored using storage and processing circuitry 50 of the stacked-chip image sensor.

At step 114, the positions of moving objects in multiple image frames may be aligned. Aligning positions of moving objects may occur in storage and processing circuitry 50.

At step 116, regions in image frame (labeled <n>) may be identified that have an abrupt change in light level (brightness) with respect to light levels in previously captured image frames (e.g., image frame <n−1>, not shown).

At step 118, the light levels of regions with identified abrupt changes in light level (brightness) in multiple image frames may be adjusted (e.g., to an intermediate brightness level corresponding to the average light level in multiple image frames). Adjusting light levels of abruptly changing light level regions may occur in storage and processing circuitry 50.

At step 120, image frame <n> having moving objects aligned and/or light levels adjusted may be stored (accumulated) in frame memory associated with storage and processing circuitry 50. Accumulating image frames in frame memory may include storing individual corrected image frames or may include combining corrected image frames in a single, stored image frame.

At step 122, a frame counter may be incremented (e.g., by raising the value of <n> to <n+1>).

At step 124 the frame count value may be compared with a predetermined maximum frame number MAX_FRAMES. If the incremented frame number is less than MAX_FRAMES, the stacked-chip image sensor may return to step 110 as indicated by line 126 and repeat the frame capture and correction steps 110, 112, 114, 116, 118, 120, and 122. If the incremented frame number is greater than or equal to MAX_FRAMES, the stacked-chip image sensor may proceed to step 128.

At step 128, the accumulated image frame(s) in frame memory associated with storage and processing circuitry 50 may be output to, for example, a device display or to storage associated with processing circuitry 18.

Various embodiments have been described illustrating methods for detection of transient signals using imaging systems having stacked-chip image sensors. An imaging system may include one or more stacked-chip image sensors. Each stacked-chip image sensor may include a vertical chip stack that includes an array of image pixels, analog control circuitry and storage and processing circuitry.

The image pixel array may be coupled to the control circuitry using vertical metal interconnects such as through-silicon vias or microbumps that route image data signals in a direction that is perpendicular to a plane defined by the array of image pixels. The vertical interconnects may include vertical column interconnects, vertical row interconnects, vertical block interconnects, or vertical internal row interconnects along an edge or interspersed within the array of image pixels.

Multiple vertical interconnects may be used to simultaneously readout pixels in multiple corresponding pixel blocks to analog-to-digital conversion circuitry associated with the control circuitry.

The analog-to-digital conversion circuitry may convert the image data to digital image data and provide the digital image data to the storage and processing circuitry over vertical conductive interconnects such as through-silicon vias. The storage and processing circuitry may be configured to store and/or process the digital image data.

The stacked-chip image sensor may be configured to capture image frames at a capture frame rate that is sufficiently high to oversample moving or oscillating-brightness objects such as a moving automobile, a swinging baseball bat in the hands of a professional baseball player swinging at a pitched ball in a live-action baseball game, or a rapidly oscillating LED light source.

The stacked-chip image sensor may be configured to process the captured image frames in parallel with the image capture operations and to output processed image frames at an output frame rate that is lower than the capture frame rate. Processing the captured image frames during image capture operations may include motion correction and/or light level adjustment operations.

The stacked-chip image sensor may be configured to accumulate processed (e.g., motion-corrected and/or light-level-corrected) image frames in frame memory associated with the storage and processing circuitry during image capture operations (e.g., in the form of multiple corrected image frames or in the form of a single accumulated, corrected image frame that is a combination of multiple corrected image frames).

The stacked-chip image sensor may include a selection engine that automatically (or with user input) chooses a given position of a moving object to which the object can be repositioned in prior and/or subsequent image frames. The selection engine may be configured to choose a given light level for a region of oscillating brightness to which the light level of the region in prior and/or subsequent image frames can be adjusted.

The stacked-chip image sensor may be configured to actively adjust image signal readout and image capture procedures during image capture operations based on previously capture image frames.

The foregoing is merely illustrative of the principles of this invention which can be practiced in other embodiments.

What is claimed is:

1. A method for operating a stacked-chip image sensor having a planar array of image pixels, control circuitry, storage and processing circuitry, a first two-dimensional array of conductive vias coupled between the planar image pixel array and the control circuitry and a second two-dimensional array of conductive vias coupled between the control circuitry and the storage and processing circuitry, the method comprising:
   with the image pixels, capturing an image frame at a first frame rate;
   with the control circuitry, reading out the image frame over a portion of the first two-dimensional array of conductive vias;
   with the control circuitry, providing the image frame to the storage and processing circuitry over a portion of the second two-dimensional array of conductive vias;
   with the storage and processing circuitry, detecting an image of a moving object in the image frame;
   with the storage and processing circuitry, generating a processed image frame by aligning the image of the detected moving object in the image frame with an image of the moving object in a previously captured image frame, wherein the plurality of previously captured image frames are captured with the image pixels; and
   with the storage and processing circuitry, outputting the processed image frame at a second frame rate that is less than the first frame rate.

2. The method defined in claim 1, further comprising:
   with the image pixels, capturing an additional image frame.

3. The method defined in claim 2, further comprising;
   with the storage and processing circuitry, detecting an image of the moving object in the additional image frame; and
   with the storage and processing circuitry, aligning the image of the detected moving object in the additional image frame with the image of the moving object in the previously captured image frame.

4. The method defined in claim 3, further comprising:
   with the storage and processing circuitry, combining the image frame that has the aligned image of the moving object and the additional image frame that has the aligned image of the moving object to form a motion-corrected image frame.

5. The method defined in claim 4, further comprising:
   with the storage and processing circuitry, outputting the motion-corrected image frame.

6. The method defined in claim 1, further comprising:
   with the storage and processing circuitry, determining motion information for the moving object.

7. The method defined in claim 6, further comprising:
   with the control circuitry, altering readout operations based on the determined motion information;
   with the image pixels, capturing an additional image frame; and
   with the control circuitry, reading out the additional image frame from the image pixels using the altered readout operations.

8. The method defined in claim 7 wherein reading out the additional image frame from the image pixels using the altered readout operations comprises:
   replacing image signals from a first set of image pixels with image signals from a second set of image pixels; and
   providing the replaced image signals from the second set of image pixels to the storage and processing circuitry.

9. A method for operating a stacked-chip image sensor having a first semiconductor substrate having opposing first and second surfaces and control circuitry, a second semiconductor substrate attached to the first surface having image sensor pixels, a third semiconductor substrate attached to the second surface having processing circuitry, vertical conductive interconnects coupled between the control circuitry and the image sensor pixels through the first surface, and additional vertical conductive interconnects coupled between the control circuitry and the processing circuitry through the second surface, wherein the control circuitry comprises row driver circuitry coupled to the vertical conductive interconnects, the method comprising:
   with the row driver, supplying pixel control signals to the image sensor pixels over the vertical conductive interconnects;
   with the image sensor pixels, capturing an image frame at a first pixel resolution;
   with the control circuitry, reading the captured image frame from the image sensor pixels to the storage and processing circuitry over the vertical conductive interconnects and the additional vertical conductive interconnects;

with the processing circuitry, generating a processed image frame at a second pixel resolution that is higher than the first pixel resolution by adjusting images of moving objects in the captured image frame;

with the processing circuitry, adjusting pixel brightness values in at least a portion of the captured image frame; and with the processing circuitry, outputting the processed image frame.

10. The method defined in claim 9 wherein adjusting the images of the moving objects in the captured image frame comprises:

with the processing circuitry, identifying the moving objects in the captured image frame; and with the processing circuitry, aligning the images of the moving objects in the captured image frame with images of the moving objects in a previously captured image frame.

11. The method defined in claim 10 wherein adjusting the pixel brightness values in at least a portion of the captured image frame comprises:

with the processing circuitry, identifying a region of changing brightness in the captured image frame; and with the processing circuitry, adjusting pixel values in the identified region of changing brightness in the captured image frame to match a previously determined brightness level for the identified region.

12. The method defined in claim 9, further comprising:

with the image sensor pixels, capturing a plurality of additional image frames;

with the processing circuitry, adjusting images of the moving objects in the plurality of additional image frames;

with the processing circuitry, adjusting pixel brightness values in at least a portion of the plurality of additional image frames;

with the processing circuitry, combining the adjusted plurality of additional image frames with the adjusted captured image frame to generate a combined image; and with the processing circuitry, outputting the combined image.

13. The method defined in claim 1, wherein the planar array of image pixels comprises image sensor pixels arranged in pixel rows and pixel columns, wherein the first two-dimensional array of conductive vias includes a plurality of vertical row interconnects, and wherein each pixel row is coupled to a selected one of the vertical row interconnects, the method further comprising:

with the control circuitry, reading out the image frame over a portion of the vertical row interconnects.

14. The method defined in claim 1, wherein the planar array of image pixels comprises image sensor pixels arranged in pixel rows and pixel columns, wherein the first two-dimensional array of conductive vias includes a plurality of vertical column interconnects, wherein each pixel column is coupled to a selected one of the vertical column interconnects, the method further comprising:

with the control circuitry, reading out the image frame over a portion of the vertical row interconnects.

15. The method defined in claim 1, wherein the planar array of image pixels comprises a plurality of pixel blocks, wherein the first two-dimensional array of conductive vias comprises a plurality of vertical block interconnects, wherein the control circuitry comprises a plurality of analog-to-digital conversion circuits, and wherein each of the plurality of vertical block interconnects couples the image pixels of a selected one of the plurality of pixel blocks to an associated one of the analog-to-digital conversion circuits, the method further comprising:

with the control circuitry, reading out the image frame over a portion of the vertical block interconnects.

* * * * *